United States Patent
Shen

(10) Patent No.: US 7,383,630 B2
(45) Date of Patent: Jun. 10, 2008

(54) METHOD FOR MAKING A CIRCUIT PLATE

(76) Inventor: Yu-Nung Shen, 4F, No. 52, Sec. 2, Chung-Shan N. Rd., Taipei City (TW)

( * ) Notice: Subject to any disclaimer, the term of this patent is extended or adjusted under 35 U.S.C. 154(b) by 312 days.

(21) Appl. No.: 11/166,058

(22) Filed: Jun. 24, 2005

(65) Prior Publication Data

US 2006/0000635 A1   Jan. 5, 2006

(30) Foreign Application Priority Data

Jun. 30, 2004   (TW) .............................. 93119684 A

(51) Int. Cl.
*H01K 3/10*   (2006.01)
*H05K 3/02*   (2006.01)
(52) U.S. Cl. ............................. 29/852; 29/835; 29/846; 29/847; 29/848
(58) Field of Classification Search .................. 29/835, 29/846, 847, 848, 852
See application file for complete search history.

(56) References Cited

U.S. PATENT DOCUMENTS 6,678,952 B2 *  1/2004  Jamil ........................... 29/847
7,174,630 B2 *  2/2007  Hsu et al. ..................... 29/842
2001/0040290 A1 * 11/2001  Sakurai et al. .............. 257/737

\* cited by examiner

*Primary Examiner*—C. J Arbes
(74) *Attorney, Agent, or Firm*—Ladas and Parry LLP

(57) ABSTRACT

A method for making a circuit plate includes: forming first holes in an insulating layer; forming a conductive layer on the insulating layer such that a portion of the conductive layer fills the first holes; grinding the conductive layer such that the portion of the conductive layer remains in the first holes to form a pattern of conductive traces; forming a dielectric protective layer that covers the insulating layer and the conductive traces; forming a pattern of second holes in the protective layer such that a portion of each of the conductive traces is accessible through a respective one of the second holes; and forming conductive bumps that are respectively connected to the conductive traces.

14 Claims, 5 Drawing Sheets

METHOD FOR MAKING A CIRCUIT PLATE

CROSS-REFERENCE TO RELATED APPLICATION

This application claims priority of Taiwanese application No. 093119684, filed on Jun. 30, 2004.

BACKGROUND OF THE INVENTION

1. Field of the Invention

This invention relates to a method for making a circuit plate, more particularly to a method for making a circuit plate using semiconductor processing techniques.

2. Description of the Related Art

Conventional circuit plates normally include a dielectric substrate that is formed with a pattern of conductive traces thereon for electrical connections among electronic components to be mounted on the substrate. Conventional methods for forming the conductive traces on the substrate involve attaching a copper film to the substrate, followed by forming the copper film into the pattern of the conductive traces through photolithographic techniques. Since the copper film is relatively thick, there is a minimum line width restriction for each of the conductive traces. As a consequence, when contacts of an electronic component, which are spaced apart by a very short distance, are to be mounted on the circuit plate, short circuits are likely to occur. Therefore, electronic components with very short spacing between contacts are unsuited for use with the conventional circuit plates.

SUMMARY OF THE INVENTION

The object of the present invention is to provide a method for making a circuit plate that is capable of overcoming the aforesaid drawback of the prior art.

According to one aspect of the present invention, there is provided a method for making a circuit plate containing conductive traces for electrical connections among electronic components to be mounted on the circuit plate. The method comprises: preparing a substrate having a dielectric portion that has a planar circuit-forming surface; forming an insulating layer on the circuit-forming surface; forming a pattern of first holes in the insulating layer using photolithographic techniques; forming a conductive layer on the insulating layer such that a portion of the conductive layer completely fills the first holes in the insulating layer; grinding the conductive layer such that the portion of the conductive layer, which fills the first holes, remains in the first holes, and that the remainder of the conductive layer is removed therefrom, thereby forming a pattern of conductive traces on the substrate; forming a dielectric protective layer that covers the insulating layer and the conductive traces; forming a pattern of second holes in the protective layer using photolithographic techniques such that a portion of each of the conductive traces is accessible through a respective one of the second holes; and forming a pattern of conductive bumps such that each of the conductive bumps extends into a respective one of the second holes to connect electrically with a respective one of the conductive traces and that each of the conductive bumps protrudes outwardly from the respective one of the second holes.

According to another aspect of the present invention, there is provided a method for making a circuit plate containing conductive traces for electrical connections among electronic components to be mounted on the circuit plate. The method comprises: preparing a substrate having a dielectric portion that has a planar circuit-forming surface; forming an insulating layer on the circuit-forming surface; forming a pattern of first holes in the insulating layer using photolithographic techniques; forming a conductive layer on the insulating layer such that a portion of the conductive layer is formed on hole-defining walls of the first holes in the insulating layer; grinding the conductive layer such that the portion of the conductive layer, which is formed on the hole-defining walls of the first holes, remains in the first holes, and that the remainder of the conductive layer is removed therefrom, thereby forming a pattern of conductive traces on the substrate; forming a dielectric protective layer that covers the insulating layer and the conductive traces; forming a pattern of second holes in the protective layer using photolithographic techniques such that a portion of each of the conductive traces is accessible through a respective one of the second holes; and forming a pattern of conductive bumps such that each of the conductive bumps extends into a respective one of the second holes to connect electrically with a respective one of the conductive traces and that each of the conductive bumps protrudes outwardly from the respective one of the second holes According to yet another aspect of the present invention, there is provided a method for making a circuit plate containing conductive traces for electrical connections among electronic components to be mounted on the circuit plate. The method comprises: preparing a substrate having a dielectric portion that has a planar circuit-forming surface; forming a conductive layer on the circuit-forming surface; forming the conductive layer into a pattern of conductive traces on the circuit-forming surface using photolithographic techniques; forming an insulating layer on the circuit-forming surface such that a portion of the insulating layer covers the conductive traces; grinding the insulating layer such that the portion of the insulating layer is removed, thereby exposing the conductive traces therefrom; forming a dielectric protective layer that covers the insulating layer and the conductive traces; forming a pattern of second holes in the protective layer using photolithographic techniques such that a portion of each of the conductive traces is accessible through a respective one of the second holes; and forming a pattern of conductive bumps such that each of the conductive bumps extends into a respective one of the second holes to connect electrically with a respective one of the conductive traces and that each of the conductive bumps protrudes outwardly from the respective one of the second holes.

BRIEF DESCRIPTION OF THE DRAWINGS

In drawings which illustrate embodiments of the invention.

DETAILED DESCRIPTION OF THE PREFERRED EMBODIMENTS

Figure 1:
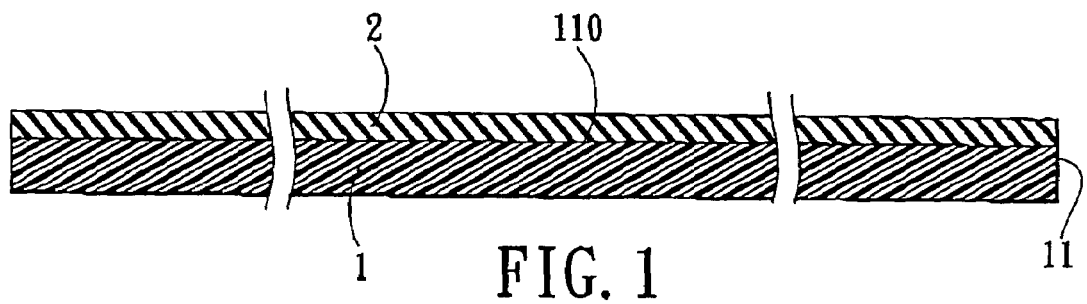
FIGS. 1 to 5 are fragmentary schematic sectional views to illustrate consecutive steps of the first preferred embodiment of a method for making a circuit plate according to the present invention.
Figure 2:
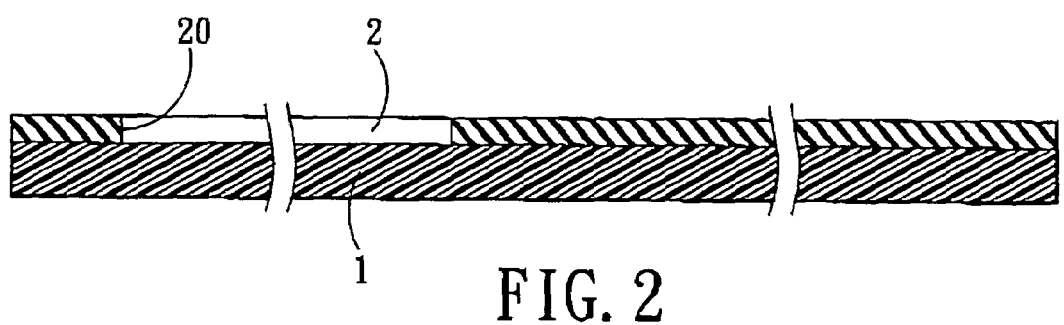
Figure 3:
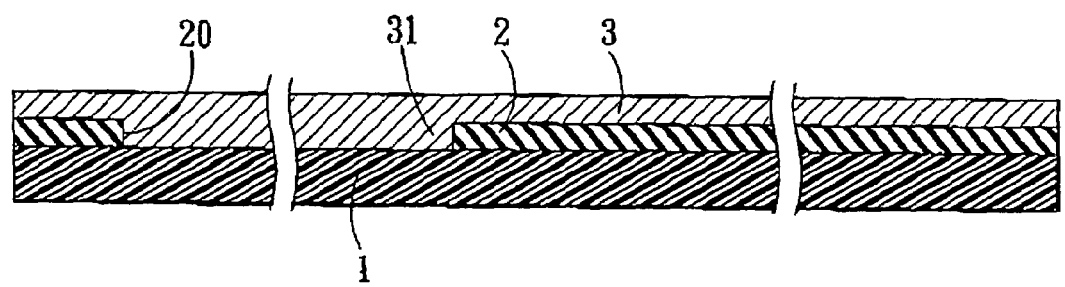

For the sake of brevity, like elements are denoted by the same reference numerals throughout the disclosure.

Figure 4:
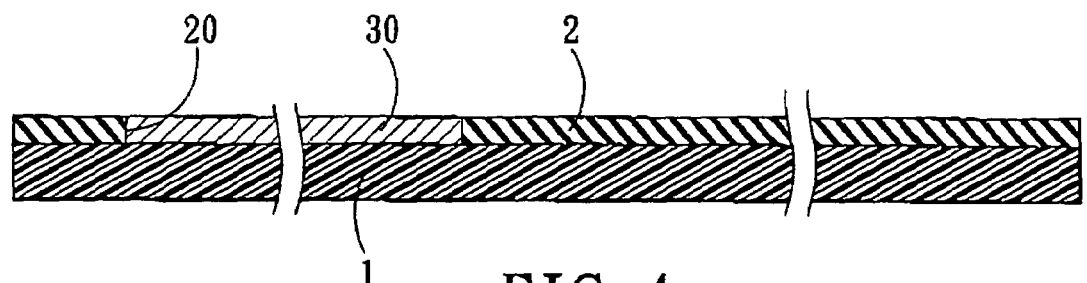

FIGS. 1 to 5 illustrate consecutive steps of the first preferred embodiment of a method for making a circuit plate according to the present invention. The circuit plate contains conductive traces 30 (only one conductive trace 30 is shown in FIG. 4) for electrical connections among electronic components (not shown) adapted to be mounted on the circuit plate.

Figure 5:
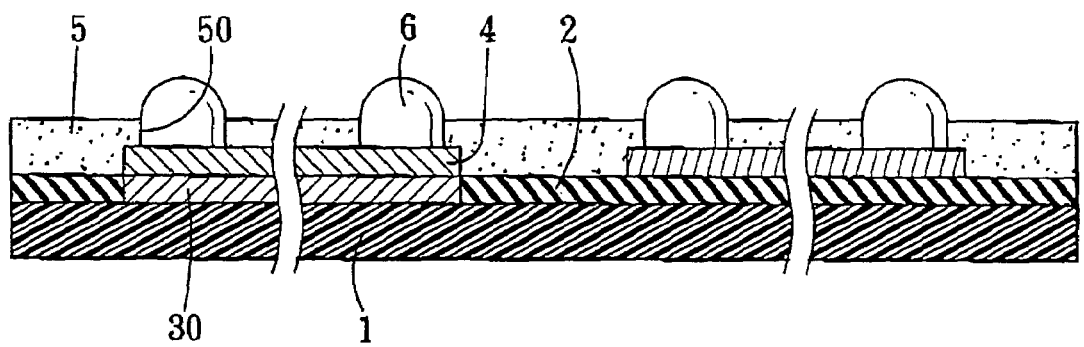
Figure 6:
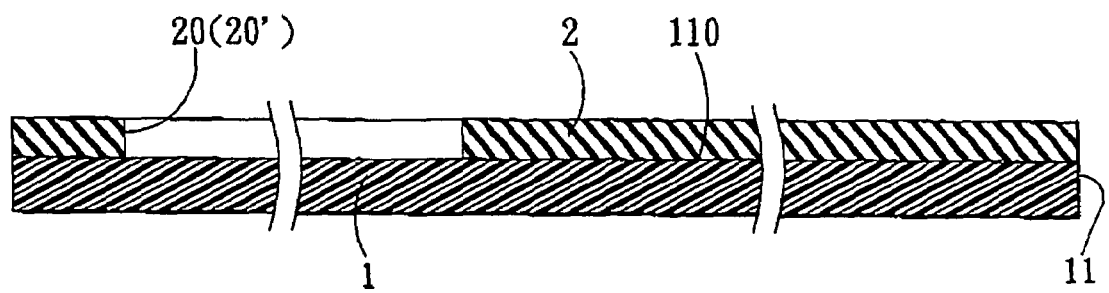
FIGS. 6 to 9 are fragmentary schematic sectional views to illustrate consecutive steps of the second preferred embodiment of a method for making a circuit plate according to the present invention.
Figure 7:
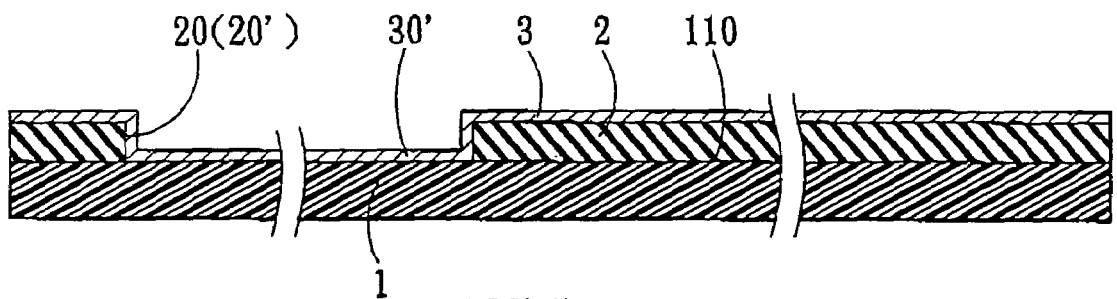
Figure 8:
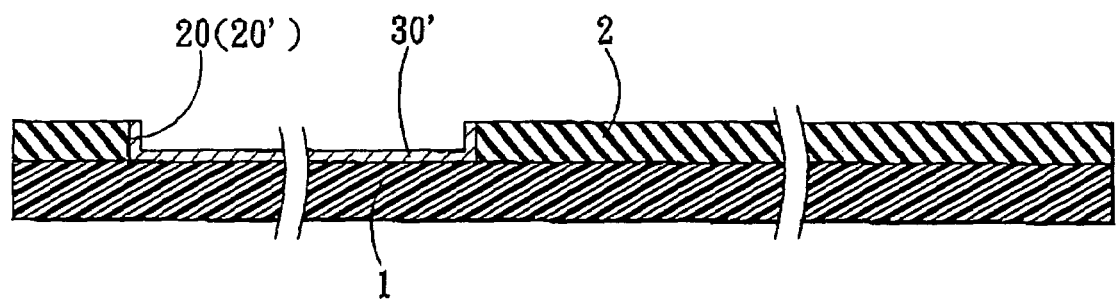

The method of this embodiment includes the steps of: preparing a substrate 1 having a dielectric portion 11 that has a planar circuit-forming surface 110 (see FIG. 1); forming an insulating layer 2 on the circuit-forming surface 110 (see FIG. 1); forming a pattern of first holes 20 (only one is shown) in the insulating layer 2 using photolithographic techniques (see FIG. 2); forming a conductive layer 3 on the insulating layer 2 such that a portion 31 of the conductive layer 3 completely fills the first holes 20 in the insulating layer 2 (see FIG. 3); grinding the conductive layer 3 such that the portion 31 of the conductive layer 3, which fills the first holes 20, remains in the first holes 20, and that the remainder of the conductive layer 3 is removed therefrom, thereby forming a pattern of the conductive traces 30 on the substrate 1 (see FIG. 4); forming a dielectric protective layer 5 that covers the insulating layer 2 and the conductive traces 30; forming a pattern of second holes 50 in the protective layer 5 using photolithographic techniques such that a portion of each of the conductive traces 30 is accessible through a respective one of the second holes 50 (see FIG. 5); and forming a pattern of conductive bumps 6 such that each of the conductive bumps 6 extends into a respective one of the second holes 50 to connect electrically with a respective one of the conductive traces 30 and that each of the conductive bumps 6 protrudes outwardly from the respective one of the second holes 50 (see FIG. 5).

In this embodiment, the conductive layer 3 is formed by applying a conductive paste to the insulating layer 2, followed by allowing the conductive paste to harden.

Preferably, a pattern of metal traces 4 is formed on the pattern of the conductive traces 30 prior to formation of the protective layer 5 such that each of the metal traces 4 covers a respective one of the conductive traces 30 (see FIG. 5). Each of the conductive bumps 6 is formed on a respective one of the metal traces 4. Each of the metal traces 4 includes at least one metal film that is made from a metal selected from the group consisting of Ni, Au, Cu, and Al. Preferably, each of the metal traces 4 has a two-ply structure with two different metal films, such as a Cu—Ni two-ply structure, or a Ni—Al two-ply structure.

The protective layer 5 is preferably made from a photo sensitive material.

Each of the conductive traces 30 thus formed is capable of achieving a line width smaller than the minimum line width of the conductive traces of the aforesaid conventional circuit plate.

In addition, the size of each of the conductive bumps 6 can be controlled by controlling the size of the second holes 50 in the protective layer 5 so that the size of each of the conductive bumps 6 corresponding to the spacing between the contacts of an electronic component to be mounted on the circuit plate can be achieved.

It is noted that although the conductive traces 30 are formed at the same level of the substrate 1 in this embodiment, the conductive traces 30 can also be formed at different levels of the substrate 1.

The entire substrate 2 can be made from an insulating material or a conductive material with a dielectric layer formed thereon.

Moreover, the substrate 1 can be formed with conductive contacts (not shown) on the circuit-forming surface 110 according to the need for connecting with the conductive traces 30.

FIGS. 6 to 9 illustrate consecutive steps of the second preferred embodiment of a method for making a circuit plate according to the present invention.

Figure 9:
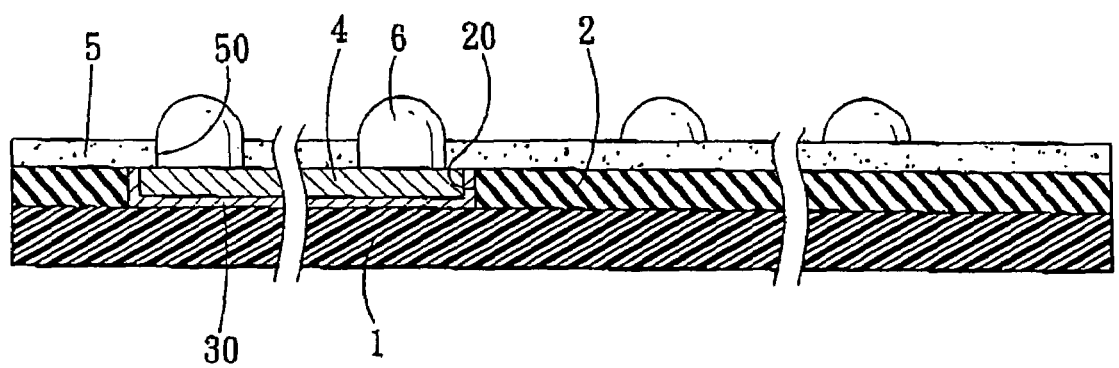
Figure 10:
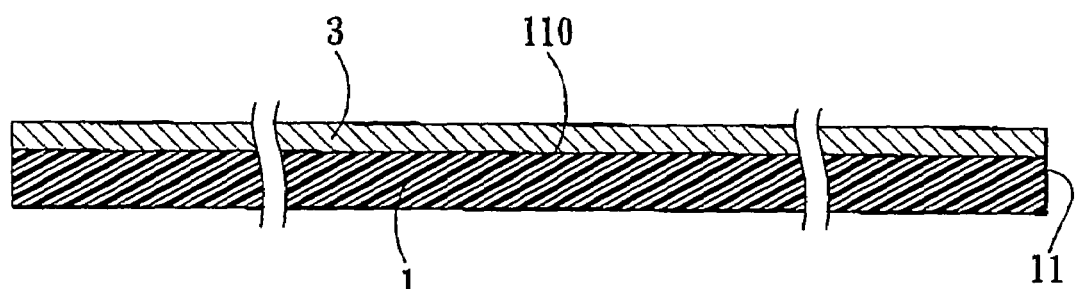
FIG. 10 to 15 are fragmentary schematic sectional views to illustrate consecutive steps of the third preferred embodiment of a method for making a circuit plate according to the present invention.
Figure 11:
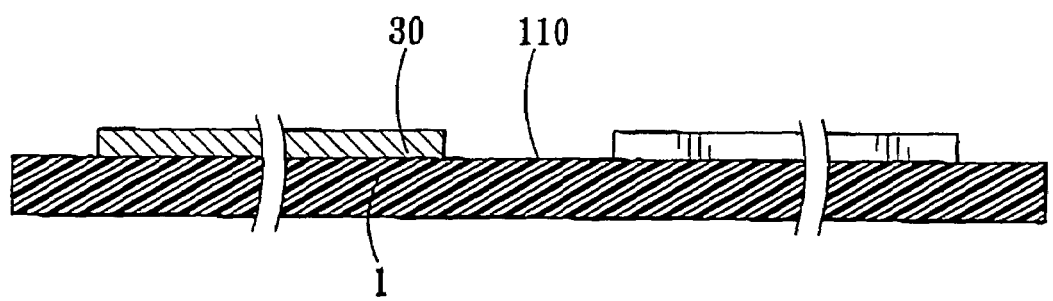
Figure 12:
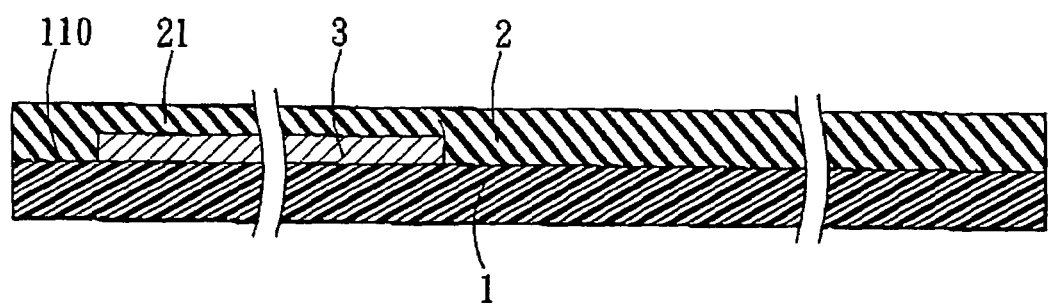
Figure 13:
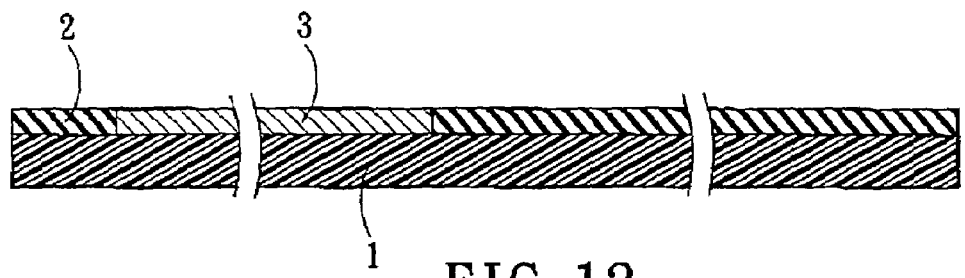

The method of this embodiment includes the steps of: preparing a substrate 1 having a dielectric portion 11 that has a planar circuit-forming surface 110 (see FIG. 6); forming an insulating layer 2 on the circuit-forming surface 110 (see FIG. 6); forming a pattern of first holes 20 (only one is shown) in the insulating layer 2 using photolithographic techniques (see FIG. 6); forming a conductive layer 3 on the insulating layer 2 such that a portion 30' of the conductive layer 3 is formed on hole-defining walls 20' of the first holes 20 in the insulating layer 2 (see FIG. 7); grinding the conductive layer 3 such that the portion 30' of the conductive layer 3, which is formed on the hole-defining walls 20' of the first holes 20, remains in the first holes 20, and that the remainder of the conductive layer 3 is removed therefrom, thereby forming a pattern of the conductive traces 30 on the substrate 1 (see FIG. 8); forming a dielectric protective layer 5 that covers the insulating layer 2 and the conductive traces 30 (see FIG. 9); forming a pattern of second holes 50 in the protective layer 5 using photolithographic techniques such that a portion of each of the conductive traces 30 is accessible through a respective one of the second holes 50 (see FIG. 9); and forming a pattern of conductive bumps 6 such that each of the conductive bumps 6 extends into a respective one of the second holes 50 to connect electrically with a respective one of the conductive traces 30 and that each of the conductive bumps 6 protrudes outwardly from the respective one of the second holes 50 (see FIG. 9).

In this embodiment, the conductive layer 3 is formed using sputtering techniques. Each of the conductive traces 30 includes at least one metal film that is made from a metal selected from the group consisting of Ni, Au, Cu, and Al.

Preferably, a pattern of metal traces 4 is formed on the pattern of the conductive traces 30 prior to formation of the protective layer 5 such that each of the metal traces 4 covers a respective one of the conductive traces 30 and fills a respective one of the first holes 20 (see FIG. 9). Each of the conductive bumps 6 is formed on a respective one of the metal traces 4. Each of the metal traces 4 includes at least one metal film that is made from a metal selected from the group consisting of Ni, Au, Cu, and Al.

FIGS. 10 to 15 illustrate consecutive steps of the third preferred embodiment of a method for making a circuit plate according to the present invention.

Figure 15:
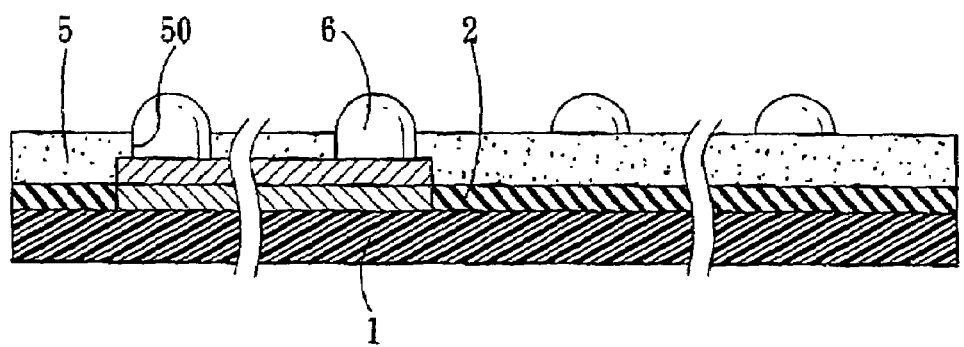

The method of this embodiment includes the steps of: preparing a substrate 1 having a dielectric portion 11 that has a planar circuit-forming surface 110 (see FIG. 10); forming a conductive layer 3 on the circuit-forming surface 110 (see FIG. 10); forming the conductive layer 3 into a pattern of conductive traces 30 on the circuit-forming surface 110 using photolithographic techniques (see FIG. 11); forming an insulating layer 2 on the circuit-forming surface 110 such that a portion 21 of the insulating layer 2 covers the conductive traces 30 (see FIG. 12) grinding the insulating layer 2 such that the portion 21 of the insulating layer 2 is removed, thereby exposing the conductive traces 30 therefrom (see FIG. 13); forming a dielectric protective layer 5 that covers the insulating layer 2 and the conductive traces 30 (see FIG. 15); forming a pattern of second holes 50 in the protective layer 5 using photolithographic techniques such that a portion of each of the conductive traces 30 is accessible through a respective one of the second holes 50 (see FIG. 15); and forming a pattern of conductive bumps 6 such that each of the conductive bumps 6 extends into a respective one of the second holes 50 to connect electrically with a respective one of the conductive traces 30 and that each of the conductive bumps 6 protrudes outwardly from the respective one of the second holes 50 (see FIG. 15).

In this embodiment, the conductive layer 3 is formed using sputtering techniques. Each of the conductive traces 30 includes at least one metal film that is made from a metal selected from the group consisting of Ni, Au, Cu, and Al.

Figure 14:
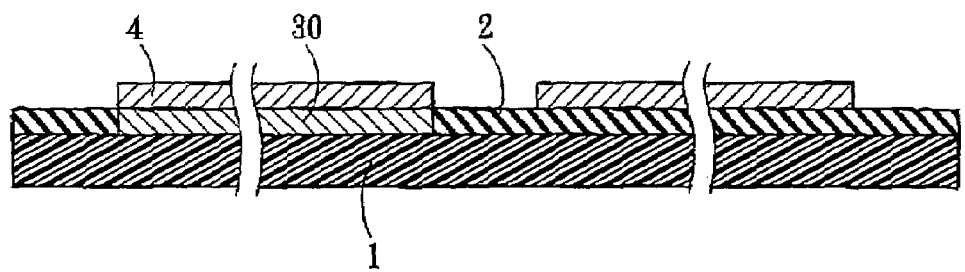

Preferably, a pattern of metal traces 4 is formed on the pattern of the conductive traces 30 prior to formation of the protective layer 5 such that each of the metal traces 4 covers a respective one of the conductive traces 30 (see FIG. 14). Each of the conductive bumps 6 is formed on a respective one of the metal traces 4. Each of the metal traces 4 includes at least one metal film that is made from a metal selected from the group consisting of Ni, Au, Cu, and Al.

By forming the conductive traces 30 and the conductive bumps 6 in the circuit plate of this invention, the aforesaid drawback associated with the prior art can be alleviated.

With the invention thus explained, it is apparent that various modifications and variations can be made without departing from the spirit of the present invention. It is therefore intended that the invention be limited only as recited in the appended claims.

I claim:

1. A method for forming a circuit plate containing conductive traces for electrical connections among electronic components to be mounted on the circuit plate, said method comprising:
   preparing a substrate having a dielectric portion that has a planar circuit-forming surface;
   forming an insulating layer on the circuit-forming surface;
   forming a pattern of first holes in the insulating layer using photolithographic techniques;
   forming a conductive layer on the insulating layer such that a portion of the conductive layer completely fills the first holes in the insulating layer;
   grinding the conductive layer such that the portion of the conductive layer, which fills the first holes, remains in the first holes, and that the remainder of the conductive layer is removed therefrom, thereby forming a pattern of conductive traces on the substrate;
   forming a dielectric protective layer that covers the insulating layer and the conductive traces;
   forming a pattern of second holes in the protective layer using photolithographic techniques such that a portion of each of the conductive traces is accessible through a respective one of the second holes; and
   forming a pattern of conductive bumps such that each of the conductive bumps extends into a respective one of the second holes to connect electrically with a respective one of the conductive traces and that each of the conductive bumps protrudes outwardly from the respective one of the second holes.

2. The method of claim 1, wherein the conductive layer is formed by applying a conductive paste to the insulating layer, followed by allowing the conductive paste to harden.

3. The method of claim 1, further comprising forming a pattern of metal traces prior to formation of the protective layer such that each of the metal traces is formed on and covers a respective one of the conductive traces, each of the conductive bumps being formed on a respective one of the metal traces.

4. The method of claim 3, wherein each of the metal traces includes at least one metal film that is made from a metal selected from the group consisting of Ni, Au, Cu, and Al.

5. A method for forming a circuit plate containing conductive traces for electrical connections among electronic components to be mounted on the circuit plate, said method comprising:
   preparing a substrate having a dielectric portion that has a planar circuit-forming surface;
   forming an insulating layer on the circuit-forming surface;
   forming a pattern of first holes in the insulating layer using photolithographic techniques;
   forming a conductive layer on the insulating layer such that a portion of the conductive layer is formed on hole-defining walls of the first holes in the insulating layer;
   grinding the conductive layer such that the portion of the conductive layer, which is formed on the hole-defining walls of the first holes, remains in the first holes, and that the remainder of the conductive layer is removed therefrom, thereby forming a pattern of conductive traces on the substrate;
   forming a dielectric protective layer that covers the insulating layer and the conductive traces;
   forming a pattern of second holes in the protective layer using photolithographic techniques such that a portion of each of the conductive traces is accessible through a respective one of the second holes; and
   forming a pattern of conductive bumps such that each of the conductive bumps extends into a respective one of the second holes to connect electrically with a respective one of the conductive traces and that each of the conductive bumps protrudes outwardly from the respective one of the second holes.

6. The method of claim 5, wherein the conductive layer is formed using sputtering techniques.

7. The method of claim 6, wherein each of the conductive traces includes at least one metal film that is made from a metal selected from the group consisting of Ni, Au, Cu, and Al.

8. The method of claim 5, further comprising forming a pattern of metal traces prior to formation of the protective layer such that each of the metal traces is formed on and covers a respective one of the conductive traces and fills a respective one of the first holes, each of the conductive bumps being formed on a respective one of the metal traces.

9. The method of claim 8, wherein each of the metal traces includes at least one metal film that is made from a metal selected from the group consisting of Ni, Au, Cu, and Al.

10. A method for forming a circuit plate containing conductive traces for electrical connections among electronic components to be mounted on the circuit plate, said method comprising:
   preparing a substrate having a dielectric portion that has a planar circuit-forming surface;
   forming a conductive layer on the circuit-forming surface;
   forming the conductive layer into a pattern of conductive traces on the circuit-forming surface using photolithographic techniques;
   forming an insulating layer on the circuit-forming surface such that a portion of the insulating layer covers the conductive traces;

grinding the insulating layer such that the portion of the insulating layer is removed, thereby exposing the conductive traces therefrom;

forming a dielectric protective layer that covers the insulating layer and the conductive traces;

forming a pattern of second holes in the protective layer using photolithographic techniques such that a portion of each of the conductive traces is accessible through a respective one of the second holes; and forming a pattern of conductive bumps such that each of the conductive bumps extends into a respective one of the second holes to connect electrically with a respective one of the conductive traces and that each of the conductive bumps protrudes outwardly from the respective one of the second holes.

11. The method of claim 10, wherein the conductive layer is formed using sputtering techniques.

12. The method of claim 11, wherein each of the conductive traces includes at least one metal film that is made from a metal selected from the group consisting of Ni, Au, Cu, and Al.

13. The method of claim 10, further comprising forming a pattern of metal traces prior to formation of the protective layer such that each of the metal traces is formed on and covers a respective one of the conductive traces, each of the conductive bumps being formed on a respective one of the metal traces.

14. The method of claim 13, wherein each of the metal traces includes at least one metal film that is made from a metal selected from the group consisting of Ni, Au, Cu, and Al.

* * * * *